US006208739B1

(12) United States Patent
Venugopal et al.

(10) Patent No.: US 6,208,739 B1
(45) Date of Patent: Mar. 27, 2001

(54) NOISE AND VIBRATION SUPPRESSION METHOD AND SYSTEM

(75) Inventors: Ravinder Venugopal; Dennis S. Bernstein, both of Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 0 days.

(21) Appl. No.: 09/081,810

(22) Filed: May 20, 1998

(51) Int. Cl.[7] .................................................. H03B 29/00

(52) U.S. Cl. .................................. 381/71.12; 381/71.11; 381/71.5

(58) Field of Search ............................ 381/71.11, 71.12, 381/71.1, 71.5

(56) References Cited

U.S. PATENT DOCUMENTS

| | | | |
|---|---|---|---|
| 5,796,920 * | 8/1998 | Hyland | 395/22 |
| 6,005,952 * | 12/1999 | Klippel | 381/71.11 |

OTHER PUBLICATIONS

Sievers and von Flotow, Comparison and Extensions of Control Methods for Narrow–Band Disturbance Rejection, IEEE Transactions on Signal Processing vol. 40, p. 2377–2399.

Messner and Bodson, Design of Adaptive Feedforward Algorithms Using Internal Model Equivalence, Int. Journal of Adaptive Control and Signal Processing, vol. 9, p. 199–212.

Elliott, et al., A Multiple Error LMS and Its Application to the Active Control of Sound and Vibration, IEEE Transactions on Acoustics, Speech, and Signal Processing, vol. ASSP–35, No. 10, p. 1423–1434.

Jiang, et al., Adaptation for Active Noise Control, IEEE Control Systems, Dec. 1997, p. 36–47.

Akers, et al., Time–Domain Identification Using ARMARKOV / Toeplitz Models, Proc. Amer. Contr. Conf., Jun. 1997, p. 191–195.

Akers, et al., ARMARKOV Least–Squares Identification, Amer. Contr. Conf., Jun. 1997, p. 186–190.

Venugopal, et al., Adaptive Disturbance Rejection Using ARMARKOV Systems Representations, Proc. of the 36 th IEEE CDC, Dec. 1997, p. 1884–1889.

* cited by examiner

*Primary Examiner*—Forester W. Isen
*Assistant Examiner*—Brian Tyrone Pendleton
(74) *Attorney, Agent, or Firm*—Barbara M. Burns

(57) ABSTRACT

A method and system for attenuating the effects of unknown, unmeasurable and time-varying exogenous disturbances on multiple-input multiple-output dynamical systems are described. The disturbance rejection system is characterized in terms of an ARMARKOV or predictive model controller. The parameters of this controller are revised in real time at discrete time steps so as to generate an input to the dynamical system that attenuates the effect of the exogenous disturbance on any chosen set of measured outputs of the dynamical system. The method for revising the controller parameters involves the steps of defining a novel retrospective cost function based on windows of past data, calculating a gradient that is based on this cost function, and using an implementable adaptive step size that brings the controller parameters closer to optimal controller parameters after each revision. The method and system are applicable to active noise and vibration control and reject single-tone, multi-tone, sine sweeping and broadband disturbances in acoustic spaces.

5 Claims, 7 Drawing Sheets

NOISE AND VIBRATION SUPPRESSION METHOD AND SYSTEM

This invention was made with government support under Grant #F49620-95-1-0019 awarded by the Air Force Office of Scientific Research. The government has certain rights in the invention.

BACKGROUND OF THE INVENTION

The field of the invention relates to the problem of rejecting exogenous disturbances acting on dynamical systems (or "plants"). In particular, the invention pertains to a method and system for noise and vibration suppression that does not require measurement of the actual disturbance.

Heretofore, several methods required a priori knowledge of the spectral characteristics of the disturbance in addition to models of all four paths in the plant including actuators and sensors shown in FIG. 1, that is, $G_{zw}$ (the "primary path"), $G_{zu}$ (the "secondary path"), $G_{yw}$ (the "reference path") and $G_{yu}$ (the "feedback path"). These methods are described in reference 5 of the appended listing of references. Other methods used for active noise control described in references 1, 2, 6 through 12, do not require knowledge about the disturbance but often require a direct measurement of it, and require an FIR (finite impulse response) or IIR (infinite impulse response) model of $G_{zu}$. These methods use instantaneous measurements for adaptation and do not accurately characterize the effect of the control over a window of time.

Despite the need for a method and system that can adapt based on retrospective information obtained from sensors to account for the effect of the system and method over a window of time, none was known. Thus, there was the need for a method and system using a retrospective performance evaluation in a special heretofore unknown form. A need also existed to determine an explicit step size or well-defined distance based upon the retrospective performance evaluation.

The disclosed method and system of this invention is applicable to a wide class of disturbance rejection problems, including but not limited to active noise and vibration control. Other applications include command-tracking in which the command is viewed as a disturbance signal whose effect is rejected in the output error signal.

The present method does not require knowledge of the disturbance spectrum nor a measurement of it, and only requires the numerator of the ARMARKOV model $G_{zu}$ denoted by the Toeplitz matrix $B_{zu}$.

The present method uses ARMARKOV models to describe the plant including sensors and actuators as well as the disturbance rejection controller. These models are described below.

SUMMARY OF THE INVENTION

It is an object of the invention to provide a method and system that evaluates performance based upon past data and determines an explicit step size or distance for adaptation, for differentiation from existing methods.

In contrast to the prior art, the method and system for achieving such rejection comprises of a set of sensors which measure the outputs of the plant for which the effect of the disturbance is to be minimized, an optional additional set of sensors which measure other outputs of the plant, converters that digitize analog signals from the sensors, a microprocessor capable of storing data from the converters and performing the calculations described in the method herein, converters that create command signals from the results of the calculations of the microprocessor, and actuators that act on the plant based on these command signals. A graphical representation of the system according to the invention is given in FIG. 1.

The plant with sensors and actuators comprise the four block unit in FIG. 1, while the microprocessor implementing the method described herein, or "controller", is the lower block marked $G_c$. The exogenous disturbance is denoted by w(k), the outputs of the system for which the effects of this disturbance are to be minimized or "performance measurements" by z(k), the additional measured outputs of the system or "feedback measurements" by y(k) and the signals generated by the controller or "control signals" by u(k). The paths from the two sets of inputs to the plant, namely, w(k) and u(k), to the two sets of outputs of the plant, namely, z(k) and y(k) are denoted by $G_{zw}$, $G_{zu}$, $G_{yw}$ and $G_{yu}$.

For a more complete understanding of the present invention, reference is made to the following detailed description when read in conjunction with the accompanying drawings wherein like reference characters refer to like elements throughout the several views, in which:

DESCRIPTION OF THE PREFERRED EMBODIMENT

To begin, we describe the ARMARKOV model of the nth-order discrete-time finite-dimensional linear time-invariant system given by $$x(k+1)=Ax(k)+Bu(k), \tag{1}$$

k=0, 1, 2, . . . , $$y(k)=Cx(k)+Du(k), \tag{2}$$

where A, B, C and D are real matrices of appropriate size, u(k) is of size $m_u$ and y(k) is of size $l_y$, and whose Markov parameters $H_j$ of size $l_y \times m_u$ are defined as $$H_j \triangleq D, \text{ for } j=-1, \tag{3}$$

-continued $$\stackrel{\Delta}{=} CA^j B, \quad \text{for } j \geq 0. \tag{4}$$

This system (1), (2) may be alternatively described by the auto-regressive moving average (ARMA) representation given by $$y(k) = -a_1 y(k-1) - \ldots - a_n y(k-n) + B_0 u(k) + \ldots + B_n u(k-n), \tag{5}$$

or the $\mu$-ARMARKOV (ARMA+Markov) model or $\mu$ step ahead predictor model $$y(k) = \sum_{j=1}^{n} -\alpha_j y(k-\mu-j+1) + \sum_{j=1}^{\mu} H_{j-1} u(k-j+1) + \sum_{j=1}^{n} B_j u(k-\mu-j+1), \tag{6}$$

where $\alpha_j$ are scalars and $B_j$ are of size $l_y \times m_u$, j=1, . . . , n. We note that in the special case $\mu$=1, the ARMARKOV form (6) is the same as the ARMA form.

Now, let p denote the data window length and define the extended measurement vector Y(k) of size $l_y p$ and the ARMARKOV regressor vector $\Phi_{yu}(k)$ of size $l_y(p+n-1)+m_u(\mu+p+n-1)$ by $$Y(k) \stackrel{\Delta}{=} \begin{bmatrix} y(k) \\ \vdots \\ y(k-p+1) \end{bmatrix}, \tag{7}$$

$$\Phi_{yu}(k) \stackrel{\Delta}{=} \begin{bmatrix} y(k-\mu) \\ \vdots \\ y(k-\mu-p-n+2) \\ u(k) \\ \vdots \\ u(k-\mu-p-n+2) \end{bmatrix}.$$

Figure 1:
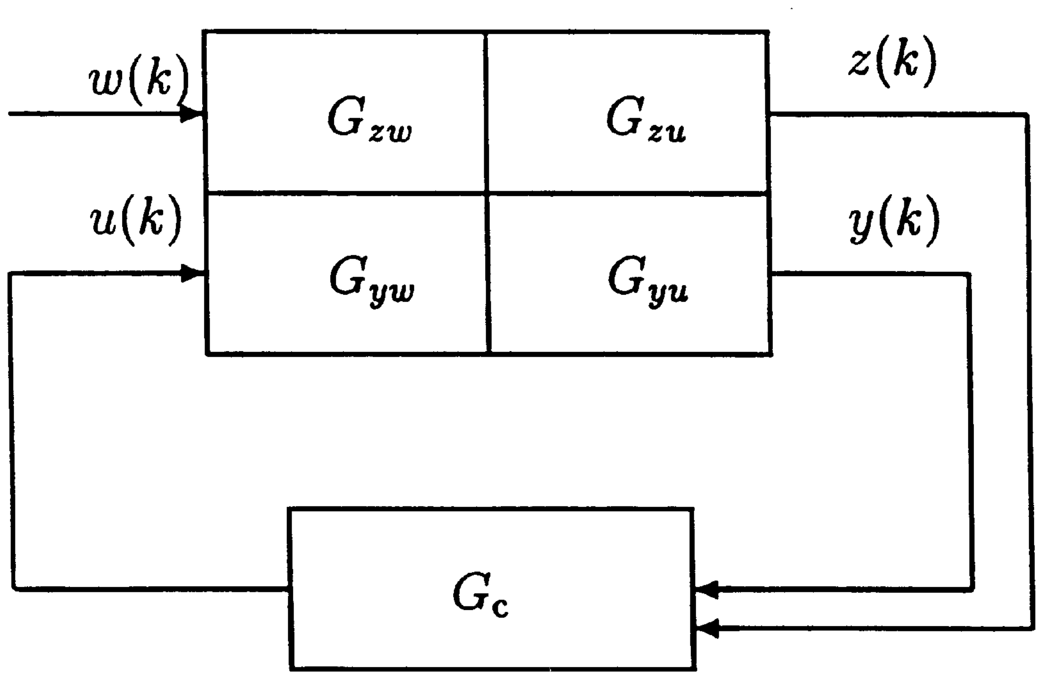
FIG. 1 illustrates a graphical representation of the system according to the invention.

Using (6), Y(k) and $\Phi_{yu}(k)$ are related by $$Y(k) = W_{yu} \Phi_{yu}(k), \tag{8}$$

where the block-Toeplitz ARMARKOV weight matrix $W_{yu}$ of size $pl_y \times [l_y(p+n-1)+m_u(\mu+p+n-1)]$ is defined by We now develop the ARMARKOV/Toeplitz model of the two vector input, two vector output plant with sensors and actuators whose inputs are the disturbance w(k) and the control u(k), and whose outputs are the feedback measurement y(k) and the performance measurement z(k) as shown in FIG. 1. The ARMARKOV form of the plant with actuators and sensors is $$z(k) = \sum_{j=1}^{n} -\alpha_j z(k-\mu-j+1) + \sum_{j=1}^{\mu} H_{zw,j-2} w(k-j+1) + \sum_{j=1}^{n} B_{zw,j} w(k-\mu-j+1) + \sum_{j=1}^{\mu} H_{zu,j-2} u(k-j+1) + \sum_{j=1}^{n} B_{zu,j} u(k-\mu-j+1), \tag{10}$$

$$y(k) = \sum_{j=1}^{n} -\alpha_j y(k-\mu-j+1) + \sum_{j=1}^{\mu} H_{yw,j-2} w(k-j+1) + \sum_{j=1}^{n} B_{yw,j} w(k-\mu-j+1) + \sum_{j=1}^{\mu} H_{yu,j-2} u(k-j+1) + \sum_{j=1}^{n} B_{yu,j} u(k-\mu-j+1), \tag{11}$$

where $\alpha_j$ are scalars, $B_{zw,j}$ and $H_{zw,j}$ are of size $l_z \times m_w$, $B_{zu,j}$ and $H_{zu,j}$ are of size $l_z \times m_u$, $B_{yw,j}$ and $H_{yw,j}$ are of size $l_y \times m_w$, and $B_{yu,j}$ and $H_{yu,j}$ are of size $l_y \times m_u$.

Next, define the extended performance measurement vector Z(k), the extended feedback measurement vector Y(k) and the extended control vector U(k) by $$Z(k) \stackrel{\Delta}{=} \begin{bmatrix} z(k) \\ \vdots \\ z(k-p+1) \end{bmatrix}, \; Y(k) \stackrel{\Delta}{=} \begin{bmatrix} y(k) \\ \vdots \\ y(k-p+1) \end{bmatrix}, \tag{12}$$

$$U(k) \stackrel{\Delta}{=} \begin{bmatrix} u(k) \\ \vdots \\ u(k-p+1) \end{bmatrix},$$

where the controller window size $p_c$ is given by $\mu$+n+p−1, and the ARMARKOV regressor vectors $\Phi_{zw}(k)$ and $\Phi_{yw}(k)$ are defined by $$W_{yu} \stackrel{\Delta}{=} \begin{bmatrix} -\alpha_1 I_{l_y} & \cdots & -\alpha_n I_{l_y} & 0_{l_y} & \cdots & 0_{l_y} & H_{-1} & \cdots & H_{\mu-2} & B_1 & \cdots & B_n & 0_{l_y \times m_u} & \cdots & 0_{l_y \times m_u} \\ 0_{l_y} & \ddots & & \ddots & \ddots & \vdots & 0_{l_y \times m_u} & \ddots & & \ddots & \ddots & & \ddots & \ddots & \vdots \\ \vdots & \ddots & \ddots & & \ddots & 0_{l_y} & \vdots & \ddots & \ddots & & \ddots & \ddots & & \ddots & 0_{l_y \times m_u} \\ 0_{l_y} & \cdots & 0_{l_y} & -\alpha_1 I_{l_y} & \cdots & -\alpha_n I_{l_y} & 0_{l_y \times m_u} & \cdots & 0_{l_y \times m_u} & H_{-1} & \cdots & H_{\mu-2} & B_1 & \cdots & B_n \end{bmatrix}. \tag{9}$$

$$\Phi_{zw}(k) \triangleq \begin{bmatrix} z(k-\mu) \\ \vdots \\ z(k-\mu-p-n+2) \\ w(k) \\ \vdots \\ w(k-\mu-p-n+2) \end{bmatrix}, \tag{13}$$

$$\Phi_{yw}(k) \triangleq \begin{bmatrix} y(k-\mu) \\ \vdots \\ y(k-\mu-p-n+2) \\ w(k) \\ \vdots \\ w(k-\mu-p-n+2) \end{bmatrix}.$$

Furthermore, define the block-Toeplitz ARMARKOV weight matrices $W_{zw}$ of size $pl_z \times [(n+p-1)l_z+(\mu+n+p-1)m_w]$ and $W_{yw}$ of size $pl_y \times [(n+p-1)l_y+(\mu+n+p-1)m_w]$ by $$B_{zu} \triangleq \begin{bmatrix} -\alpha_1 I_{l_z} & \dots & -\alpha_n I_{l_z} & 0_{l_z} & \cdots & 0_{l_z} & H_{zw,-1} & \cdots & H_{zw,\mu-2} & B_{zw,1} & \cdots & B_{zw,n} & 0_{l_z\times m_w} & \cdots & 0_{l_z\times m_w} \\ 0_{l_z} & \ddots & & \ddots & \ddots & \vdots & 0_{l_z\times m_w} & \ddots & & \ddots & \ddots & & \ddots & \ddots & \vdots \\ \vdots & \ddots & \ddots & & \ddots & 0_{l_z} & \vdots & \ddots & \ddots & & \ddots & \ddots & & \ddots & 0_{l_z\times m_w} \\ 0_{l_z} & \cdots & 0_{l_z} & -\alpha_1 I_{l_z} & \cdots & -\alpha_n I_{l_z} & 0_{l_z\times m_w} & \cdots & 0_{l_z\times m_w} & H_{zw,-1} & \cdots & H_{zw,\mu-2} & B_{zw,1} & \dots & B_{zw,n} \end{bmatrix}, \tag{14}$$

$$W_{yw} \triangleq \begin{bmatrix} -\alpha_1 I_{l_y} & \dots & -\alpha_n I_{l_y} & 0_{l_y} & \cdots & 0_{l_y} & H_{yw,-1} & \cdots & H_{yw,\mu-2} & B_{yw,1} & \cdots & B_{yw,n} & 0_{l_y\times m_w} & \cdots & 0_{l_y\times m_w} \\ 0_{l_y} & \ddots & & \ddots & \ddots & \vdots & 0_{l_y\times m_w} & \ddots & & \ddots & \ddots & & \ddots & \ddots & \vdots \\ \vdots & \ddots & \ddots & & \ddots & 0_{l_y} & \vdots & \ddots & \ddots & & \ddots & \ddots & & \ddots & 0_{l_y\times m_w} \\ 0_{l_y} & \cdots & 0_{l_y} & -\alpha_1 I_{l_y} & \cdots & -\alpha_n I_{l_y} & 0_{l_y\times m_w} & \cdots & 0_{l_z\times m_w} & H_{yw,-1} & \cdots & H_{yw,\mu-2} & B_{yw,1} & \dots & B_{yw,n} \end{bmatrix}, \tag{15}$$

and the block-Toeplitz ARMARKOV control matrices $B_{zu}$ of size $pl_z \times p_c m_u$ and $B_{yu}$ of size $pl_y \times p_c l_u$ by $$B_{zu} \triangleq \begin{bmatrix} H_{zu,-1} & \cdots & H_{zu,\mu-2} & B_{zu,1} & \cdots & B_{zu,1} & 0_{l_z\times m_u} & \cdots & 0_{l_z\times m_u} \\ 0_{l_z\times m_u} & \ddots & & \ddots & \ddots & & \ddots & \ddots & \vdots \\ \vdots & \ddots & \ddots & & \ddots & \ddots & & \ddots & 0_{l_z\times m_u} \\ 0_{l_z\times m_u} & \cdots & 0_{l_z\times m_u} & H_{zu,-1} & \cdots & H_{zu,\mu-2} & B_{zu,1} & \cdots & B_{zu,n} \end{bmatrix}, \tag{16}$$

$$B_{yu} \triangleq \begin{bmatrix} H_{yu,-1} & \cdots & H_{yu,\mu-2} & B_{yu,1} & \cdots & B_{yu,1} & 0_{l_y\times m_u} & \cdots & 0_{l_y\times m_u} \\ 0_{l_y\times m_u} & \ddots & & \ddots & \ddots & & \ddots & \ddots & \vdots \\ \vdots & \ddots & \ddots & & \ddots & \ddots & & \ddots & 0_{l_z\times m_u} \\ 0_{l_y\times m_u} & \cdots & 0_{l_y\times m_u} & H_{yu,-1} & \cdots & H_{yu,\mu-2} & B_{yu,1} & \cdots & B_{yu,n} \end{bmatrix}. \tag{17}$$

Then (10) and (11) can be written in the form $$Z(k)=W_{zw}\Phi_{zw}(k)+B_{zu}U(k), \tag{18}$$

$$Y(k)=W_{yw}\Phi_{yw}(k)+B_{yu}U(k), \tag{19}$$

which is the ARMARKOV/Toeplitz model of the augmented plant.

Next, we formulate an adaptive disturbance rejection feedback algorithm for the system represented by (18) and (19). We use a strictly proper controller $G_c$ in ARMARKOV form of order $n_c$ with $\mu_c$ Markov parameters, so that, analogous to (6), the control input u(k) is given by $$u(k) = \sum_{j=1}^{n_c} -\alpha_{c,j}(k)u(k-\mu_c-j+1) + \sum_{j=1}^{\mu_c-1} H_{c,j-1}(k)y(k-j+1) + \sum_{j=1}^{n_c} B_{c,j}(k)y(k-\mu_c-j+1), \tag{20}$$

where the controller Markov parameter $H_{c,j}$ is of size $m_u \times l_y$. Next, define the controller parameter block vector θ(k) by $$\theta(k) \triangleq [-\alpha_{c,1}(k)I_{m_u} \ \cdots \ -\alpha_{c,n_c}(k)I_{m_u} \ \ H_{c,0}(k) \ \cdots \ H_{c,\mu_c-2}(k) \ \ B_{c,1}(k) \ \cdots \ B_{c,n_c}(k)], \tag{21}$$

where θ(k) is of size $m_u \times [n_c m_u + (n_c + \mu_c - 1) l_y]$. Now from (12) and (20) it follows that u(k) and U(k) are given by $$u(k) = \theta(k) R_1 \Phi_{uy}(k) \tag{22}$$

and $$U(k) = \sum_{i=1}^{p_c} L_i \theta(k - i + 1) R_i \Phi_{uy}(k), \tag{23}$$

where $$\Phi_{uy}(k) \triangleq \begin{bmatrix} u(k-\mu_c) \\ \vdots \\ u(k-\mu_c-n_c-p_c+2) \\ y(k-1) \\ \vdots \\ y(k-\mu_c-n_c-p_c+2) \end{bmatrix}, \tag{24}$$

and where $$L_i \triangleq \begin{bmatrix} 0_{(i-1)m_u \times m_u} \\ I_{m_u} \\ 0_{(p_c-i)m_u \times m_u} \end{bmatrix} \tag{25}$$

is of size $p_c m_u \times m_u$ with $I_{m_u}$ denoting the identity matrix of size $m_u$, and $$R_i \triangleq \begin{bmatrix} 0_{q1\times(i-1)m_u} & I_{q1\times q1} & 0_{q1\times(p_c-i)m_u} & 0_{q1\times(i-1)l_y} & 0_{q1\times q2} & 0_{q1\times(p_c-i)l_y} \\ 0_{q2\times(i-1)m_u} & 0_{q2\times q1} & 0_{q2\times(p_c-i)m_u} & 0_{q1\times(i-1)l_y} & I_{q2\times q2} & 0_{q2\times(p_c-i)l_y} \end{bmatrix} \tag{26}$$

is of size $[n_c m_u + (n_c + \mu_c - 1) l_y] \times [(n_c + p_c - 1) m_u + (n_c + \mu_c + p_c - 2) l_y]$, with $q_1 \triangleq n_c m_u$ and $q_2 \triangleq (n_c + \mu_c - 1) l_y$. Thus, from (18) and (23) we obtain $$Z(k) = W_{zw}\Phi_{zw}(k) + B_{zu} \sum_{i=1}^{p_c} L_i \theta(k - i + 1) R_i \Phi_{uy}(k). \tag{27}$$

Next, we describe the update law for the controller parameter block vector θ(k). To do this, we define a retrospective performance cost function that evaluates the performance of the controller obtained from the current value of θ(k) based upon the measurements of the system during the previous $p_c$ steps. Therefore, we define the estimated performance $\hat{Z}(k)$ by $$\hat{Z}(k) \triangleq W_{zw}\Phi_{zw}(k) + B_{zu} \sum_{i=1}^{p_c} L_i \theta(k) R_i \Phi_{uy}(k), \tag{28}$$

which has the same form as (27) but with θ(k−i+1) replaced by the current controller parameter block vector θ(k). Using (28) we define the retrospective performance cost function $$J(k) = \tfrac{1}{2} \hat{Z}^T(k) \hat{Z}(k), \tag{29}$$

with "T" denoting the transpose of a vector. Next, the gradient of J(k) with respect to θ(k) is given by $$\frac{\partial J(k)}{\partial \theta(k)} = \sum_{i=1}^{p_c} L_i^T B_{zu}^T \hat{Z}(k) \Phi_{uy}^T(k) R_i^T. \tag{30}$$

Since w(k) is not available, which implies that $\Phi_{zw}(k)$ is unknown, $\hat{Z}(k)$ cannot be calculated from (28). However, it follows from (18) and (28) that $$\hat{Z}(k) = Z(k) - B_{zu}\left(U(k) - \sum_{i=1}^{p_c} L_i \theta(k) R_i \Phi_{uy}(k)\right), \tag{31}$$

which can be used to evaluate (30).

The gradient (30) is used in the update law $$\theta(k+1) = \theta(k) - \eta(k) \frac{\partial J(k)}{\partial \theta(k)}, \tag{32}$$

where η(k) is the adaptive step size. To determine the adaptive step size η(k), we assume that there is a controller parameter block vector θ* that minimizes J(k) for all k. The method does not need to know θ*.

Now, we define the desired performance $$\hat{Z}^*(k) \triangleq W_{zw}\Phi_{zw}(k) + B_{zu} \sum_{i=1}^{p_c} L_i \theta^* R_i \Phi_{uy}(k), \tag{33}$$

and the performance error $$\varepsilon(k) \triangleq \hat{Z}^*(k) - \hat{Z}(k). \tag{34}$$

Our goal is to determine η(k) such that θ(k) moves closer to θ* after each update. For convenience, we define the optimal adaptive step size $$\eta_{opt}(k) \triangleq \frac{\|\varepsilon(k)\|_2^2}{\left\| \frac{\partial J(k)}{\partial \theta(k)} \right\|_F^2}, \tag{35}$$

where $\| \ \|_F$ denotes the matrix Frobenius norm and $\| \ \|_2$ denotes the vector Euclidean norm. It is shown in reference 16 that $$\|\theta^* - \theta(k+1)\|_F \leq \|\theta^* - \theta(k)\|_F \tag{36}$$

if and only if η(k) satisfies $$0<\eta(k)<2\eta_{opt}(k). \quad (37)$$

Furthermore, $\eta(k)=\eta_{opt}(k)$ minimizes $\|\theta^*-\theta(k+1)\|_F-\|\theta^*-\theta(k)\|_F$.

Figure 2:
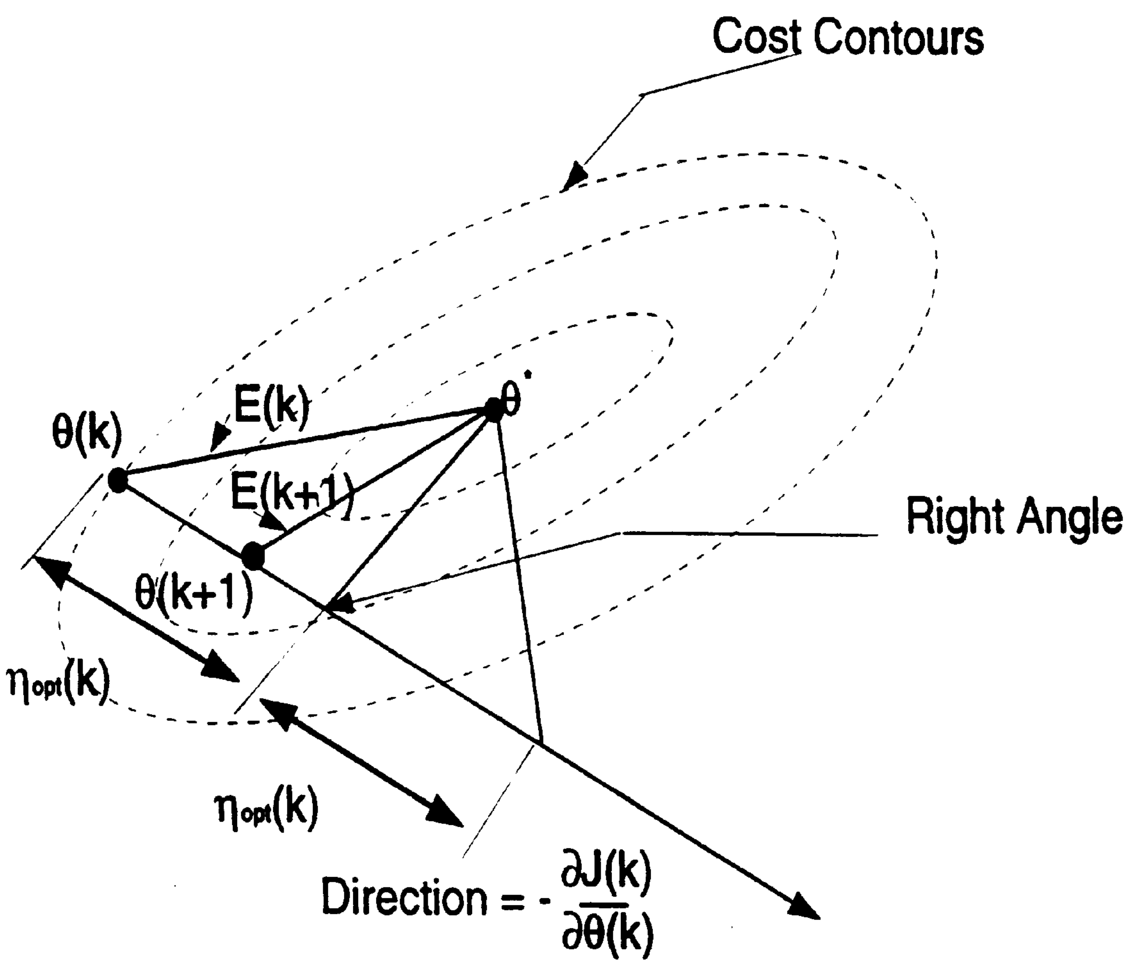
FIG. 2 illustrates a geometrical interpretation of the method according to the invention.

A geometrical interpretation of the procedure detailed above is now presented. Using FIG. 2 for reference, the objective of the algorithm is to move the controller parameter block vector θ(k) closer to the optimal controller parameter block vector θ*. The direction in which to move is the negative of the gradient $$\frac{\partial J(k)}{\partial \theta(k)}$$

which is obtained from the retrospective performance cost function. The distance to move at each time step is determined by the adaptive step size η(k). It is shown that the step size $\eta_{opt}(k)$ moves θ(k) to the point closest to θ* along the negative gradient direction, that is, to a point such that the vectors E(k+1) and $$-\frac{\partial J(k)}{\partial \theta(k)}$$

are at right angles.

In practice, $\eta_{opt}(k)$ is not computable since ε(k) is not available from sensor measurements. The crucial innovative feature of the method in this invention is the use of an implementable adaptive step size which can be calculated from available data and is guaranteed to be within the range (37) that mathematically demonstrates that θ(k) moves closer to θ*. Three such step sizes are given below:

$$\eta_1(k) \triangleq \frac{1}{\left(\left[\sum_{i=1}^{p_c} \|R_i\Phi_{uy}(k)\|_2\bar{\sigma}(B_{zu}L_i)\right]\right)^2}, \quad (38)$$

$$\eta_2(k) \triangleq \frac{1}{\|\Phi_{uy}(k)\|_2^2\left[\sum_{i=1}^{p_c} \bar{\sigma}(B_{zu}L_i)\right]^2}, \quad (39)$$

$$n_3(k) \triangleq \frac{1}{p_c\|B_{zu}\|_F^2\|\Phi_{uy}(k)\|_2^2} \quad (40)$$

where $\bar{\sigma}(B_{zu}L_i)$ denotes the maximum singular value of the matrix $B_{zu}L_i$. Note that if $B_{zu}$ is known, then $\eta_1(k)$, $\eta_2(k)$ or $\eta_3(k)$ can be calculated and used to implement (32). Other implementable adaptive step sizes satisfying (37) may be obtained. The step sizes $\eta_1(k)$, $\eta_2(k)$ and $\eta_3(k)$ satisfy $$0<\eta_3\leq\eta_2(k)\leq\eta_1(k)\leq\eta_{opt}(k), \quad (41)$$

and thus satisfy (37).

The steps involved in implementing the adaptive algorithm are as follows:

0. Obtaining the matrix $B_{zu}$ using the identification algorithm of reference 14, 15 or by calculating from an ARMA or state space representation of $G_{zu}$.

1. Calculating the control signal u(k) from the controller parameter block vector θ(k) and the vector $\Phi_{uy}(k)$ using (20).

2. Using the signals u(k), z(k) and y(k) updating the estimated performance vector $\hat{Z}(k)$ as defined in (31).

3. Calculating the retrospective gradient $$\frac{\partial J(k)}{\partial \theta(k)}$$

using (30).

4. Calculating an implementable adaptive step size such as $\eta_1(k)$, $\eta_2(k)$ or $\eta_3(k)$ from (38), (39) or (40).

5. Revising the controller parameter block vector θ(k) using (32).

6. Updating $\Phi_{uy}(k+1)$ as defined in (24).

Steps 1 through 5 are performed at each time step k.

Figure 3:
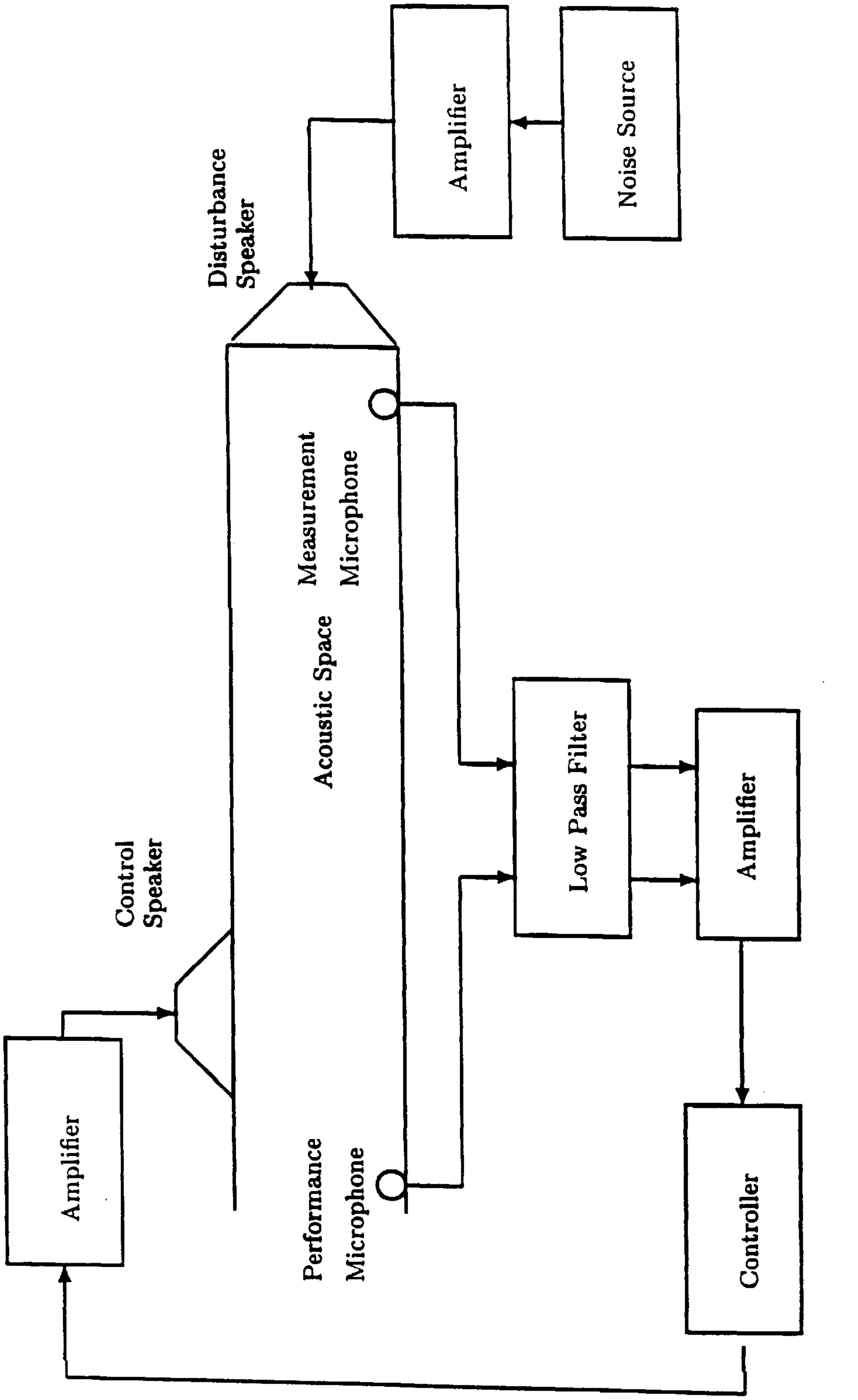
FIG. 3 illustrates a graphical representation of an experimental set-up for the invention.

Experimental demonstration of the ARMARKOV adaptive disturbance algorithm for active noise control is performed on an acoustic duct of circular cross section. The duct is 80 inches long and has a diameter of 4 inches. The disturbance speaker (w) is located at one end of the duct and the measurement sensor (y), a microphone, is located 4 inches in from the same end of the duct. The performance sensor (z), a microphone, is positioned 6 inches in from the other end. Alternative sensors for vibration control are accelerometers and piezo-electric sensors. The control actuator (u), a speaker, is placed 16 inches in from that end of the duct. A servovalve for flow modulation of compressed air is another form of actuation for noise control while proof mass actuators can be used for vibration control. The signals from the two microphones are amplified by a dbx 760x microphone preamplifier while the control signal is amplified by an Alesis RA-100 amplifier. Both speakers are Radio Shack 6 inch woofers. A graphical representation of the experimental set-up is shown in FIG. 3.

The algorithm is tested on four types of disturbances, namely, a single-tone disturbance (139.65 Hz), a two-tone disturbance (135.74 Hz and 160.4 Hz), band-limited white noise (up to 390 Hz) and AM radio noise. The algorithm uses n=4 and $\mu$=12 for the secondary path matrix $B_{zu}$, and $n_c$=2, $\mu_c$=10 and p=2 for control. The controller is implemented on a dSPACE ds1102 real time board running a TMS320C30 DSP processor at a sampling frequency of 800 Hz. The microphone signals are processed through an Ithaco DL 4302 low pass filter that rolls off at 315 Hz. The tonal and band-limited white noise disturbances are generated by a Stanford Research Systems 770 FFT network analyzer and amplified by an Optimus STA-825 stereo receiver.

Figure 4:
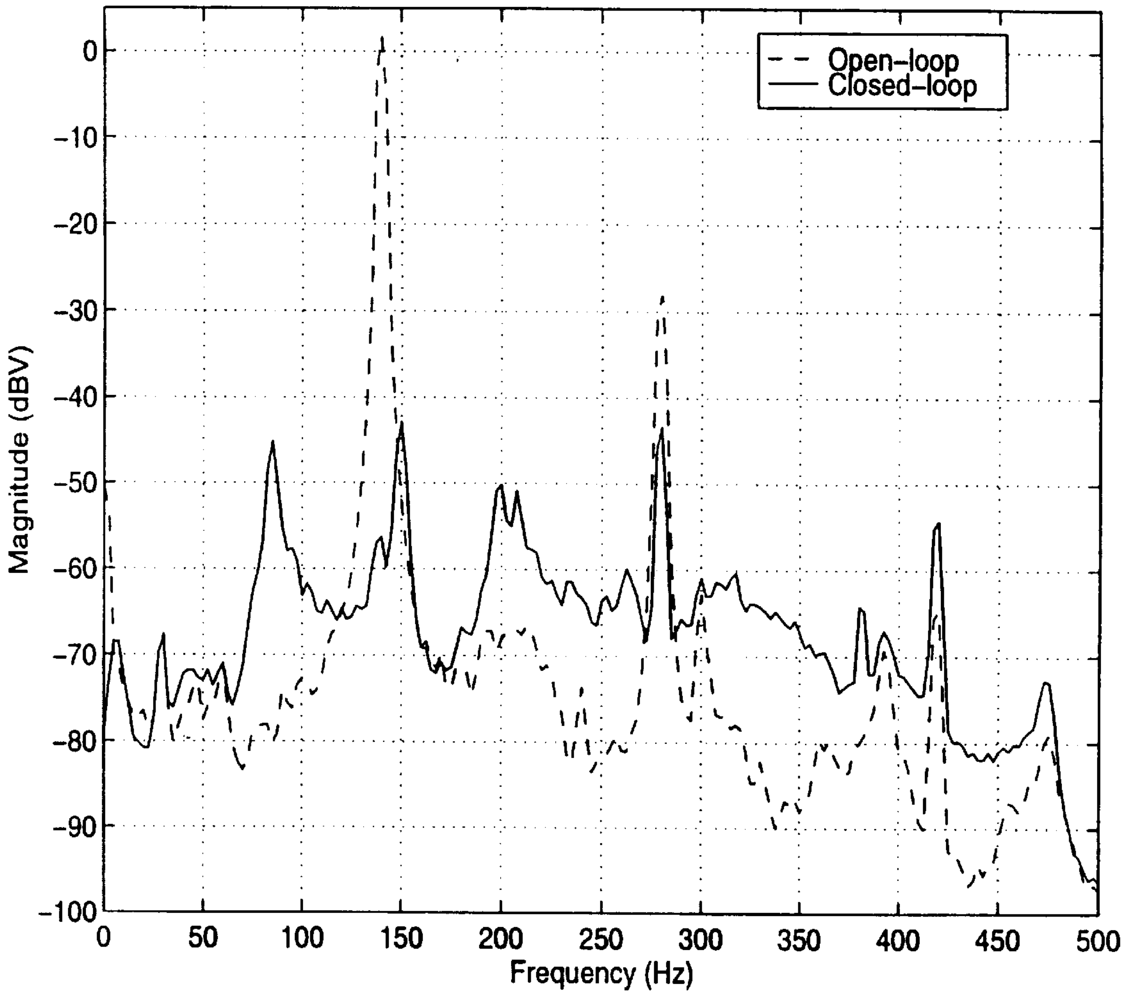
FIG. 4 illustrates the results of the system in active mode compared with the results of the system in inactive mode for a single-tone disturbance at 139.65 Hz.

FIG. 4 shows the acoustic response with the disturbance rejection system inactive ("open-loop") and with the disturbance rejection system active ("closed-loop") with a single-tone disturbance. Disturbance attenuation of more than 40 dB is achieved with convergence in about 1 second. The system and method provide the same level of attenuation by adaptation when the frequency of the disturbance tone is changed, as in sine sweeps, while the system is active.

Figure 5:
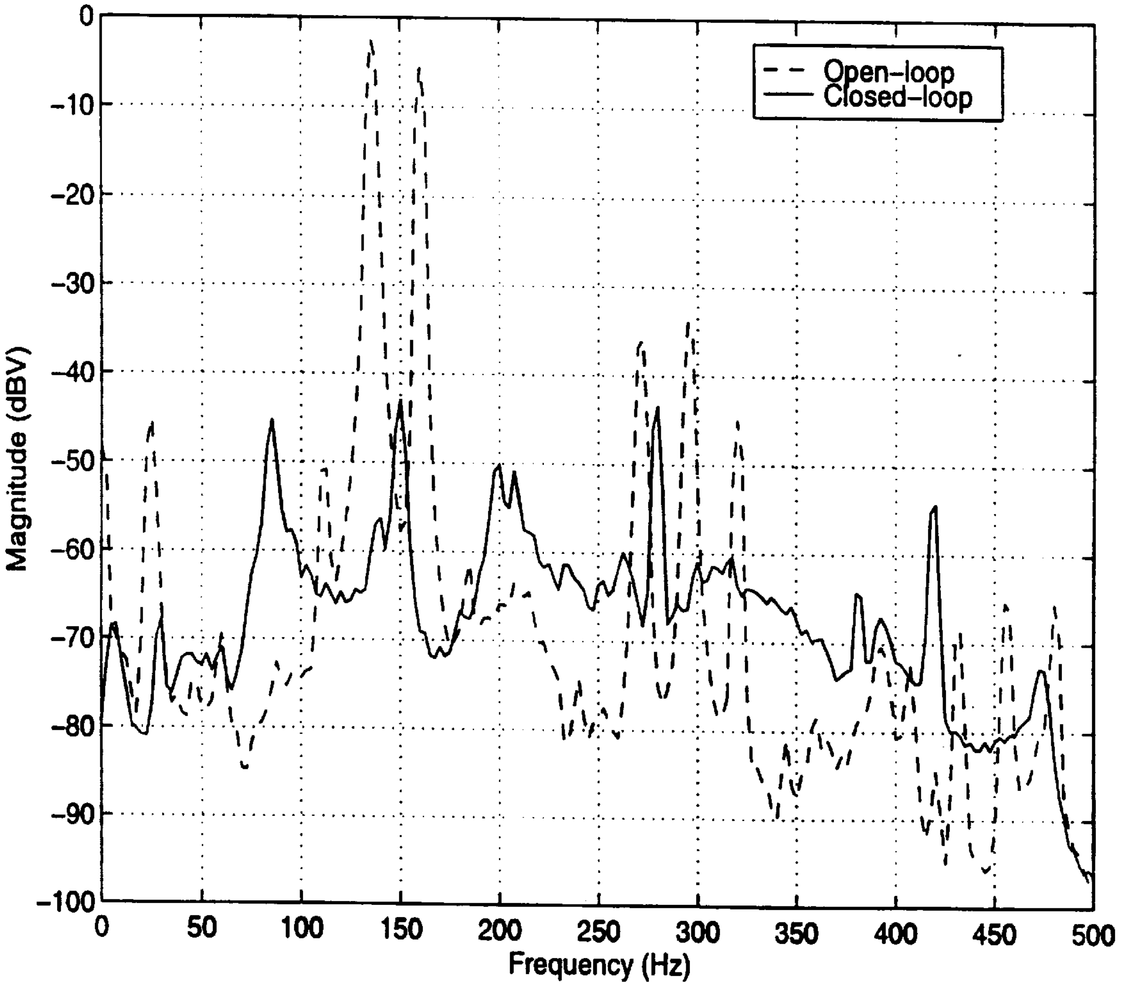
FIG. 5 illustrates the results of the system in active mode compared with the results of the system in inactive mode for a dual-tone disturbance at 139.74 Hz and 160.4 Hz.
Figure 6:
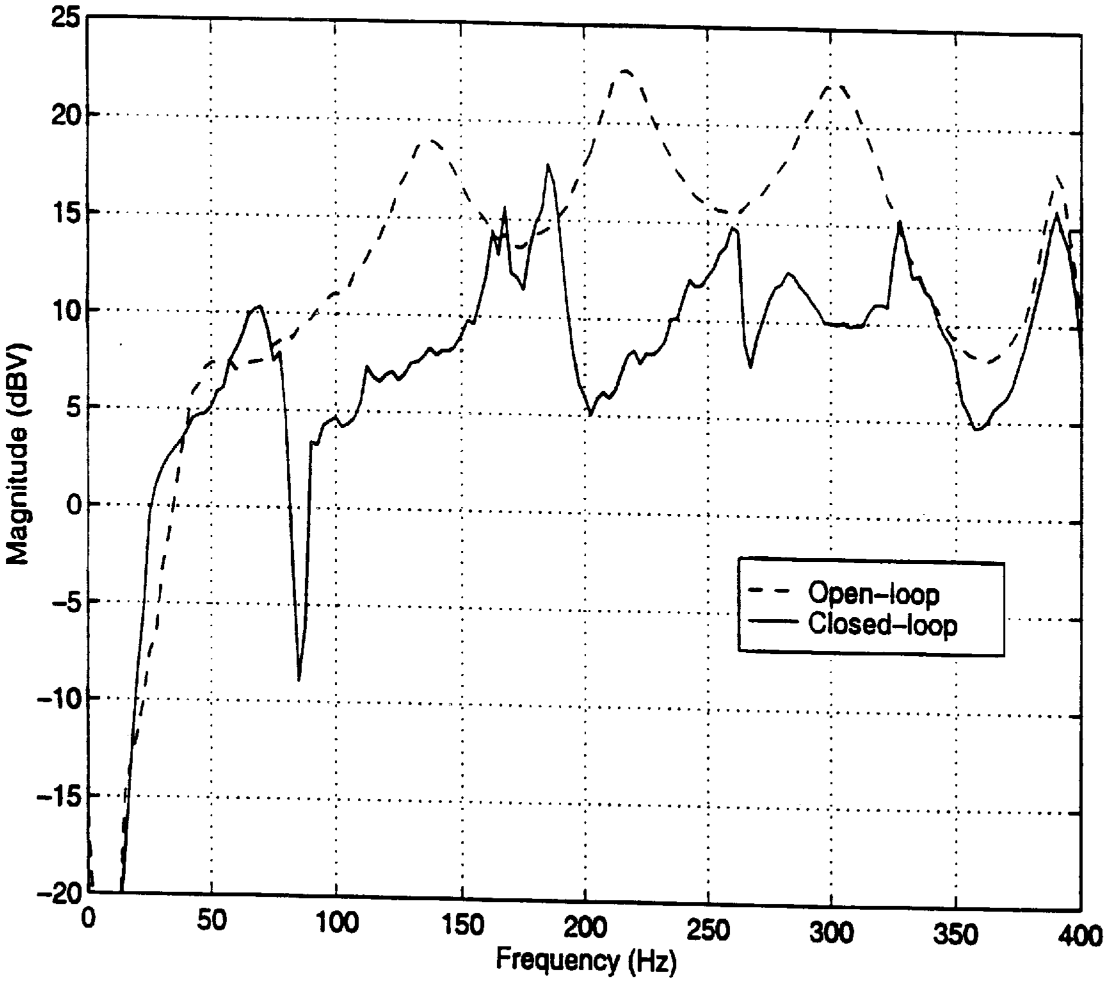
FIG. 6 illustrates the results of the system in active mode compared with the results of the system in inactive mode for band-limited white noise.
Figure 7:
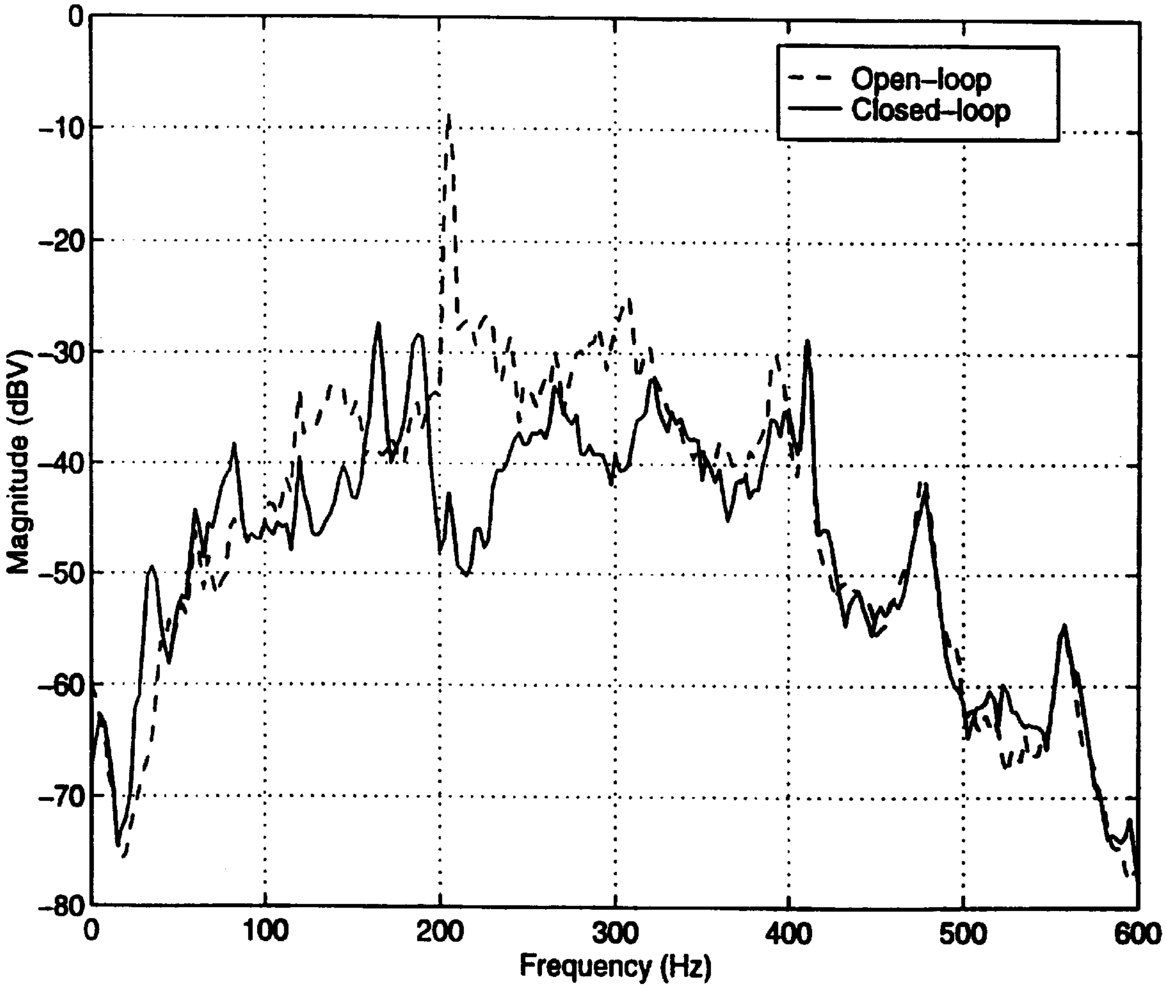
FIG. 7 illustrates the results of the system in active mode compared with the results of the system in inactive mode with AM radio disturbance.

FIG. 5 shows the open-loop and closed-loop performance with a two-tone disturbance. In this case, disturbance attenuation of more than 35 dB is observed. FIG. 6 shows the open-loop and closed-loop magnitude plots of the transfer function from disturbance to performance with a white noise disturbance, and noise suppression of up to 15 dB is observed over a frequency range from 0 to 300 Hz. Finally, FIG. 7 shows the open-loop and closed-loop frequency response with an AM radio disturbance. Noise reduction levels of up to 40 dB are observed over the frequency range 0 to 300 Hz.

In contrast and improvement to the prior art, the present method has three innovative features. The first is the use of ARMARKOV/Toeplitz structures for describing both the plant and controller. While these structures have been used for predictive and neural net control as described in references 3, 4 and 13, the present method uses them in retrospective fashion to obtain a controller update law that learns from past data.

The second innovation is the definition of the retrospective cost function and calculation of the gradient with respect to this cost function. In the prior art, instantaneous or predicted cost functions are used.

The third innovation is the use of an implementable adaptive step size for the controller update which guarantees that the controller parameters move closer to the unknown optimal controller parameters at each time step.

Having described the invention, many modifications thereto will become apparent to those skilled in the art to which it pertains without deviation from the spirit of the invention as defined in the appended claims.

REFERENCES

[1] G. E. Warnaka, Active Noise Control, U.S. Pat. No. 5,511,127, April 1996.

[2] M. K. Ferguson, S. C. Southward and M. C. Heath, Active Noise and Vibration Cancellation System, U.S. Pat. No. 5,619,581, April 1997.

[3] D. W. Cawlfield, Model Predictive Control Apparatus and Method, U.S. Pat. No. 5,519,605, May 1996.

[4] D. C. Hyland and J. N. Juang, Series Parallel Approach to Identification of Dynamic Systems, U.S. Pat. No. 5,680,513, October 1997.

[5] B. Francis, *A Course in H∞ Control Theory*, New York: Springer-Verlag, 1987.

[6] P. A. Nelson and S. J. Elliot, *Active Control of Sound.* New York: Academic Press, 1992.

[7] S. M. Kuo and D. R. Morgan, *Active Noise Control Systems.* New York: Wiley, 1996.

[8] L. A. Sievers and A. H. von Flotow, "Comparison and Extensions of Control Methods for Narrow Band Disturbance Rejection," *IEEE Transactions on Signal Processing,* Vol. 40, pp. 2377–2391, 1992.

[9] W. Messner and M. Bodson, "Design of Adaptive Feedforward Alogrithms Using Internal Model Equivalence," *International Journal of Adaptive Control and Signal Processing,* Vol. 9, pp. 199–212, 1995.

[10] S. J. Elliot, I. M. Stothers and P. A. Nelson. "A Multiple Error LMS Algorithm and its Applications to the Active Control of Sound and Vibration," *IEEE Transactions on Acoustics, Speech and Signal Processing,* Vol. ASSP-35, pp. 1423–1434, 1987.

[11] B. Widrow and E. Walach, *Adaptive Inverse Control.* NJ: Prentice Hall, 1996.

[12] F. Jiang, H. Tsuji, N. Ojiro, H. Ohmori and A. Sano, "Adaptation for Active Noise Control," *IEEE Control Systems Magazine,* pp. 36–47, December 1997.

[13] K. J. Astrom and B. Wittenmark, *Adaptive Control,* second edition, Reading Mass.: Addison-Wesley, 1995.

[14] J. C. Akers and D. S. Bernstein, "Time-Domain Identification Using ARMARKOV/Toeplitz Models," *Proc. Amer. Contr. Conf.,* pp. 191–195, Albuquerque, N.Mex., June 1997.

[15] J. C. Akers and D. S. Bernstein, "ARMARKOV Least-Squares Identification," *Proc. Amer. Contr. Conf.,* pp. 186–190, Albuquerque, N.Mex., June 1997.

[16] R. Venugopal and D. S. Bernstein, "Adaptive Disturbance Rejection Using ARMARKOV System Representations," *Proc. IEEE Conf. Dec. Contr.,* pp. 1884–1889, San Diego, Calif., December 1997.

What is claimed is:

1. A method for rejecting exogenous disturbances by adaptive disturbance rejection at a chosen set of outputs of a dynamic system for active noise and vibration control, the method comprising the following steps:

determining an ARMARKOV numerator matrix for a path from a multiplicity of control inputs to a multiplicity of performance outputs;

constructing a controller ARMARKOV matrix;

creating a multiplicity of data vectors;

calculating at least one retrospective gradient from said multiplicity of data vectors and said ARMARKOV numerator matrix;

revising said controller ARMARKOV matrix using said at least one retrospective gradient and at least one implementable adaptive step size; and calculating a control signal based on the controller ARMARKOV matrix and said data vectors.

2. A system for adaptive disturbances rejection at a chosen set of outputs of a dynamic system for active noise and vibration control, the system comprising:

means for measuring outputs of a dynamic system;

means for determining an ARMAKOV model's numerator matrix for a path from a multiplicity of control inputs to a multiplicity of control outputs;

means for converting the outputs to a digital form;

means for storing the digital form of the outputs;

means for performing calculations using the stored digital form of the outputs, the means for performing calculations calculating a retrospective gradient and an adaptive step size;

means for converting the the retrospective gradient and the adaptive step size into at least one control signal; and means for actuating the system according to the at least one control signal.

3. The system according to claim 2 wherein the means for storing the digital form of the output comprises a microprocessor.

4. The system according to claim 2 wherein the means for performing calculations using the stored digital form of the output data comprises a microprocessor.

5. A system for adaptive disturbances rejection at a chosen set of outputs of a dynamic system for active noise and vibration control, the system comprising:

means for measuring outputs of a dynamic system;

means for converting the outputs to a digital form;

means for storing the digital form of the outputs;

means for performing calculations using the stored digital form of the outputs determined by an ARMAKOV model's numerator matrix, the means for performing calculations calculating a retrospective gradient and an adaptive step size, means for converting the calculated retrospective gradient and the calculated adaptive step size into at least one control signal; and means for actuating the system according to the at least one control signal.

* * * * *